United States Patent
Hsieh et al.

(10) Patent No.: US 9,123,656 B1
(45) Date of Patent: Sep. 1, 2015

(54) ORGANOSILICATE POLYMER MANDREL FOR SELF-ALIGNED DOUBLE PATTERNING PROCESS

(71) Applicant: Taiwan Semiconductor Manufacturing Co., Ltd., Hsin-Chu (TW)

(72) Inventors: Wen-Kuo Hsieh, Taipei (TW); Ming-Chung Liang, Hsin-Chu (TW); Jyu-Horng Shieh, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/276,232

(22) Filed: May 13, 2014

(51) Int. Cl.
*H01L 21/311* (2006.01)
*H01L 21/308* (2006.01)

(52) U.S. Cl.
CPC ........ *H01L 21/3086* (2013.01); *H01L 21/3088* (2013.01)

(58) Field of Classification Search
CPC .............. H01L 21/308; H01L 21/0337; H01L 21/0338; H01L 21/3088; H01L 21/31144; H01L 21/32139; H01L 21/3086; H01L 21/76802
USPC .................................................. 438/703, 725
See application file for complete search history.

(56) References Cited

U.S. PATENT DOCUMENTS

| | | | |
|---|---|---|---|
| 7,001,833 B2 | 2/2006 | Bao et al. | |
| 7,910,283 B2 | 3/2011 | Ogihara et al. | |
| 8,258,056 B2 | 9/2012 | Chang | |
| 8,629,040 B2 | 1/2014 | Chang et al. | |
| 2008/0057692 A1* | 3/2008 | Wells et al. | 438/597 |
| 2008/0070165 A1* | 3/2008 | Fischer et al. | 430/314 |
| 2011/0111596 A1* | 5/2011 | Kanakasabapathy | 438/694 |
| 2013/0071560 A1 | 3/2013 | Rao et al. | |
| 2014/0187047 A1* | 7/2014 | Tagami et al. | 438/703 |

* cited by examiner

*Primary Examiner* — Trung Q Dang
(74) *Attorney, Agent, or Firm* — Eschweiler & Associates, LLC

(57) ABSTRACT

An organosilicate polymer is used as mandrel in a two exposure double patterning process. The mandrel layer is formed from the organosilicate polymer and is patterned with a first etching process. Spacers are formed adjacent the mandrel using low temperature process. The spacer material can be a low temperature oxide. The mandrel layer is then further patterned with a second lithographic etching process. A hard mask layer is then printed with a pattern defined by the spacers and the mandrel. The hard mask can be TiN. The process provides a simplified method of double patterning that eliminates the need for a capping layer over the hard mask.

20 Claims, 6 Drawing Sheets

ORGANOSILICATE POLYMER MANDREL FOR SELF-ALIGNED DOUBLE PATTERNING PROCESS

BACKGROUND

The present disclosure relates to integrated circuit device manufacturing processes, especially self-aligned double patterning.

In conventional photolithography, a photoresist is exposed to light through a mask. The photoresist is modified by the exposure in such a way that either the exposed or unexposed portions of the resist can be removed during subsequent development. Any photolithographic process has limitations, whereby there is a critical dimension below which features are too fine to be resolved. That resolution limit is a barrier in reducing the scale of integrated circuit devices.

Self-aligned double patterning is a technique for forming features having a finer pitch than would be possible by the direct application of a photolithographic process. Self-aligned double patterning involves forming a mandrel having line-shaped features. A spacer formation process is then used to form spacers on the sides of the mandrel features. The mandrel can then be stripped leaving the spacers defining two sets of lines. A first set of lines (L1 lines) corresponds to line-shaped features of the mandrel. A second set of lines (L2 lines) corresponds to the spaces between adjacent line-shaped features of the mandrel.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
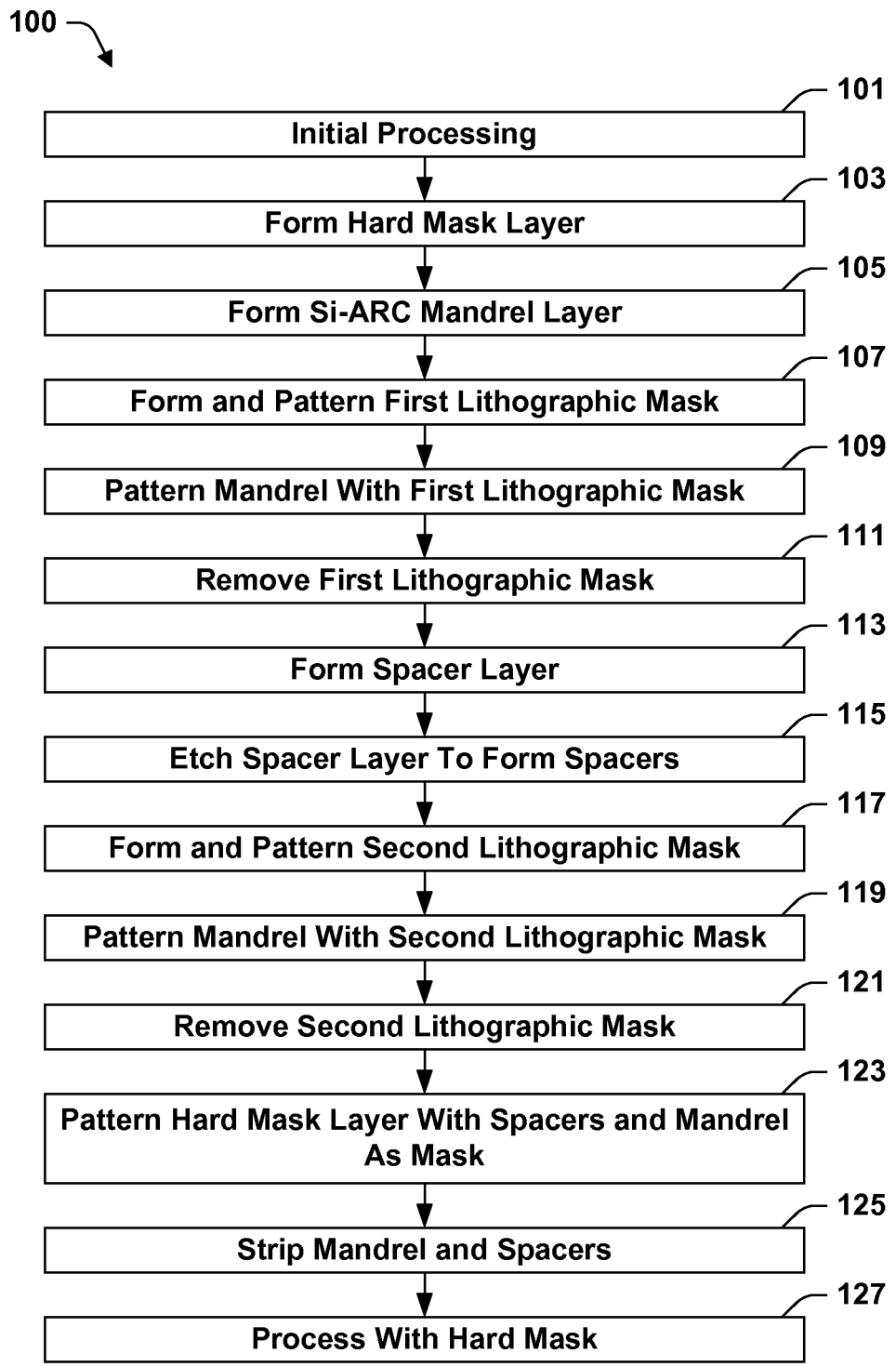
FIG. 1 is a flow chart of an integrated circuit device manufacturing process in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a self-aligned double-patterning process that includes two lithography and etching operations though which the mandrel is patterned. This type of process can be referred to as an SALE2 process. In an SALE2, some areas of the layer beneath the mandrel can be etched twice. It has been observed that if the mandrel is formed directly over the hard mask, the hard mask can develop pits or stitching in those places where it has been etched twice. Hard mask stitching can result in problems during subsequent processing. Stitching can be avoided by providing a capping layer of a material such as TEOS between the mandrel and the hard mask.

That capping layer can be eliminated in embodiments of the present disclosure in which a mandrel is formed from an organosilicate polymer. In some embodiments, the organosilicate polymer is of the kind used as an anti-reflective coating material. In some embodiments, spacers that are formed to the sides of the mandrel as part of the SALE2 process are formed of a material that is deposited at temperatures below those at which the organosilicate polymer is damaged. In some embodiments, the spacers are formed of a low temperature oxide. The organosilicate polymer mandrel and associated spacers allow for a different etch chemistry as compared to an amorphous silicon mandrel. In some embodiments, the organosilicate polymer mandrel is etched using fluorine-based chemistry. By comparison, a polysilicon mandrel is generally etched with a chlorine or bromine-based chemistry. The difference in chemistry allows the organosilicate polymer mandrel to be etched by a process that does not cause hard mask stitching. The organosilicate polymer mandrel can be formed in direct contact with the hard mask, eliminating the need for the capping layer and resulting in a simpler process. In most embodiments, the hard mask is TiN.

Figure 2:
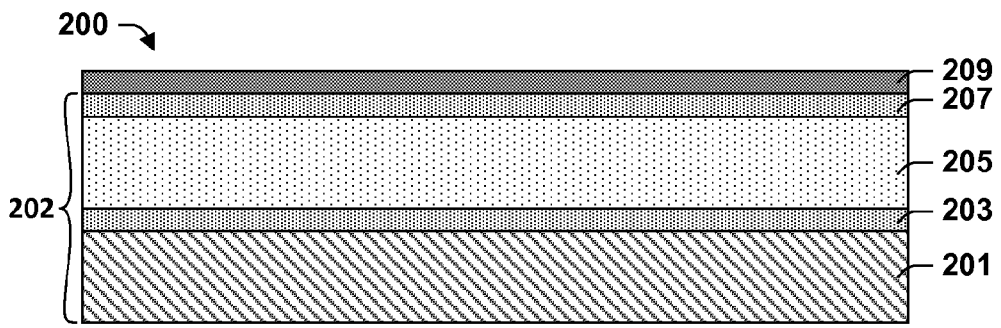
FIGS. 2-16 illustrate an integrated circuit device according to some embodiments of the present disclosure at various intermediate stages of manufacture.

FIG. 1 provides a flow chart of an integrated circuit device manufacturing process 100 according to some embodiments of the present disclosure. FIGS. 2-16 illustrate an integrated circuit device 200 according to some embodiments of the present disclosure undergoing manufacturing by the process 100. Process 100 begins with act 101, initial processing of a semiconductor body 201 to form a substrate 202, then act 103, which is forming a hard mask layer 209 over substrate 202 to produce structure as shown in FIG. 2.

Substrate 202 includes a semiconductor body 201, which is a semiconductor. The semiconductor can be, for example, an elementary semiconductor, a compound semiconductor, or an alloy semiconductor. Examples of elementary semiconductors include silicon and germanium. Examples of compound semiconductors include silicon carbide, gallium arsenide, gallium phosphide, indium phosphide, indium arsenide, and indium antimonide. Examples of alloy semiconductor including SiGe, GaAsP, AlInAs, AlGaAs, GaInAs, GaInP, and/or GaInAsP. Additional examples of semiconductors include, without limitation, group III-V materials and doped carbon. In some embodiments, semiconductor body 201 is a wafer. In some embodiments, semiconductor body 201 is silicon. In some embodiments, semiconductor body 201 is semiconductor-on-insulator. Substrate 202 can also include multiple wafers or die that are stacked upon one another.

Initial processing 101 produces the substrate 202 from semiconductor body 201. Initial processing 101 can form various component devices and device structures in or on semiconductor body 201. Component devices can include active devices or passive devices. A component device can be, for example, a memory device, a logical device, or a field effect transistor (FET). Device structures can include source regions, drain regions, gate electrodes, insulators, conductors, and metal interconnect layers.

In some embodiments, substrate 202 includes various layers that are formed over semiconductor body 201. In the example of FIG. 2, these layers include an etch stop layer 203, a dielectric layer 205, and a capping layer 207. Etch stop layer 203 can be, for example, one or more layers of oxygen-doped, nitrogen-doped, or metal-doped silicon carbide. In some embodiments, dielectric layer 205 is a low-k dielectric layer. A low-k dielectric is a material having a smaller dielectric constant than $SiO_2$. $SiO_2$ has a dielectric constant of about 4.0. Examples of low-k dielectrics that may be suitable for dielectric layer 205 include organosilicate glasses (OSG) such as carbon-doped silicon dioxide, fluorine-doped silicon dioxide (otherwise referred to as fluorinated silica glass (or FSG), and organic polymer low-k dielectrics. Examples of organic polymer low-k dielectrics include polyarylene ether, polyimide (PI), benzocyclbbutene, and amorphous polytetrafluoroethylene (PTFE). In some embodiments, dielectric layer 205 is an extremely low-k dielectric layer. An extremely low-k dielectric is a material having a dielectric constant of about 2.1 or less. An extremely low-k dielectric can be formed from a low-k dielectric material by providing the material with porosity of gaps that reduce its effective dielectric constant. Capping layer 207 can be any suitable material. In some embodiments, capping layer 207 is a nitrogen-free anti-reflective layer (NFARL), for example, oxygen-doped SiC. Etch stop layer 203, dielectric layer 205, and capping layer 207 layers are all optional layers.

Hard mask layer 209 is a layer of material that process 100 patterns into a hard mask 209 for treating at least one layer of substrate 202. In some embodiments, hard mask layer 209 is a metal compound. In some embodiments, hard mask layer 209 is TiN, which is a particularly effective hard mask material for some types of processing. In some embodiments, the layer of substrate 202 that is treated using hard mask 209 is dielectric layer 205. In some embodiments, the layer of substrate 202 that is treated using hard mask 209 is semiconductor body 201. In some embodiments, the treatment that is applied using hard mask 209 is etching trenches or holes in or through a layer of substrate 202. In some embodiments, the treatment that is applied using hard mask 209 is ion implantation.

Figure 3:
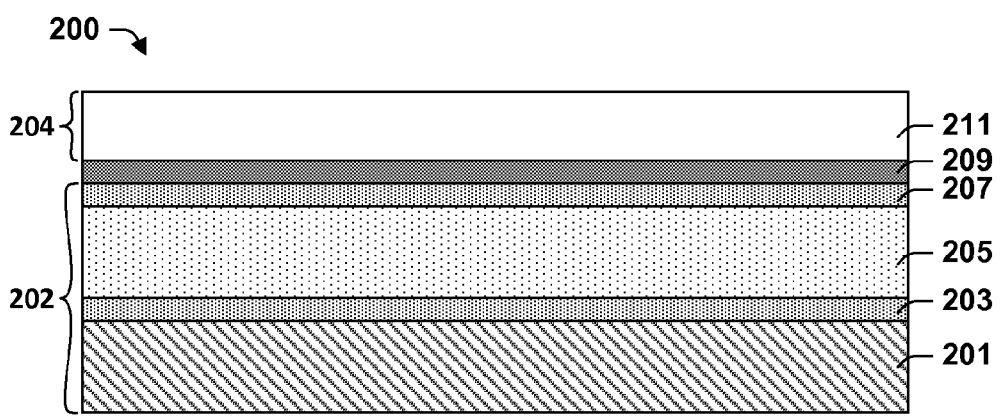

Process 100 continues with act 105, forming mandrel layer stack 204 over hard mask layer 209 as shown in FIG. 3. In some embodiments, mandrel layer stack 204 is from 100 to 500 Å thick. Mandrel layer stack 204 includes at least an upper layer 211, which is an organosilicate polymer layer. In some embodiments, mandrel layer stack 204 is a single layer of a single material, which is organosilicate polymer layer 211. In some embodiments, organosilicate polymer layer 211 is formed by spin coating. A spin-coated organosilicate polymer layer 211 can be less expensive in comparison to an amorphous silicon mandrel layer form by chemical vapor deposition (CVD).

In some embodiments, organosilicate polymer layer 211 is formed of a material that is known in the industry as a silicon-containing anti-reflective coating material. In some embodiments, organosilicate polymer layer 211 is from 10% to 70% Si. In some embodiments, organosilicate polymer layer 211 is a silsesquioxane. In some embodiments, organosilicate polymer layer 211 is a polymer or copolymer of an alkoxy or acyloxy silane. In some embodiments, organosilicate polymer layer 211 is a cross-linkable polymer. In some embodiments, forming organosilicate polymer layer 211 includes baking to induce cross-linking.

Figure 4:
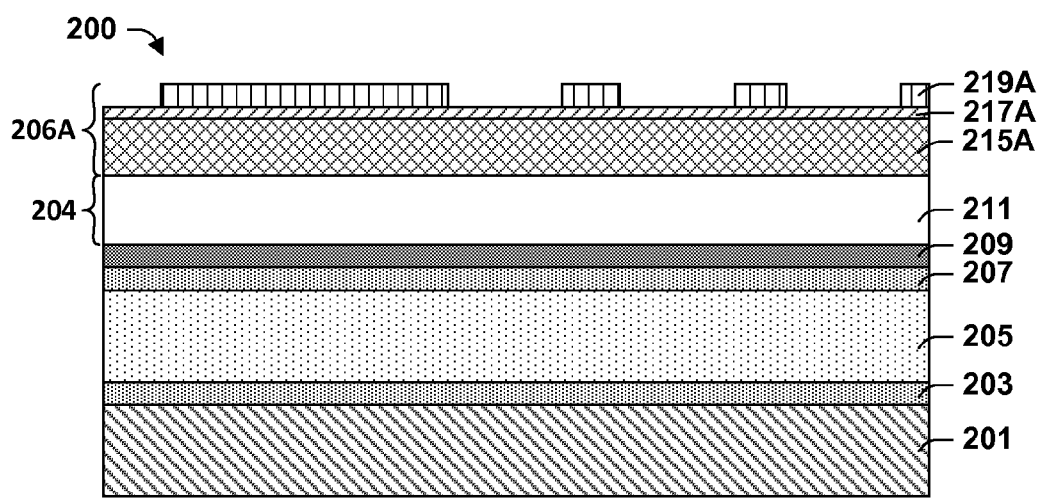

Process 100 continues with act 107, which is forming and patterning a first lithographic mask 206A over organosilicate polymer layer 211 as shown in FIG. 4. A lithographic mask is one or more layers of material that is patterned using photolithography. Photolithography includes forming a photoresist, selectively exposing the photoresist to light having a suitable wavelength, and developing the photoresist. The light is passed through a reticle, which defines a pattern of selective exposure. Developing removes a portion of the photoresist to leave a patterned photoresist. The portion removed can be either the portion that was exposed to the light or the portion that was not exposed according to whether the photoresist is a positive photoresist or a negative photoresist. In some embodiments, lithographic mask 206A is a patterned photoresist. In some embodiments, lithographic mask 206A includes one or more layers formed beneath the photoresist and patterned using the photoresist.

The purpose of lithographic mask 206A is patterning mandrel layer stack 204. A photoresist having sufficient thickness to pattern mandrel layer stack 204 can be difficult to expose and develop while controlling critical dimensions. In some embodiments, this difficulty is overcome using a lithographic mask 206A including at least an upper layer that is a photoresist and an underlying layer that is thicker than the photoresist. The photoresist can be used to pattern the thicker underlying layer and the patterned underlying layer can then be used as the mask for patterning mandrel layer stack 204. In some embodiments, lithographic mask 206A is a tri-layer mask as shown in FIG. 4. These mask layers can be formed by spin coating, for example.

A tri-layer lithographic mask 206A includes a bottom layer 215A, a middle layer 217A, and a photoresist layer 219A. Photoresist layer 219A is a photoresist material. In some embodiments, bottom layer 215A is a polymer, such as a polymer suitable for forming a bottom anti-reflective coating. Bottom layer 215A is thick in comparison to middle layer 217A and photoresist layer 219A. In some embodiments, bottom layer 215A is from 1000 to 3000 Å thick. Middle layer 217A is optional. In some embodiments, middle layer 217A is a polymer like bottom layer 215A, but with a higher silicon content. In some embodiments, middle layer 217A includes from 10% to 70% Si. In some embodiments, bottom layer 215A is a polymer with no Si content.

Figure 5:
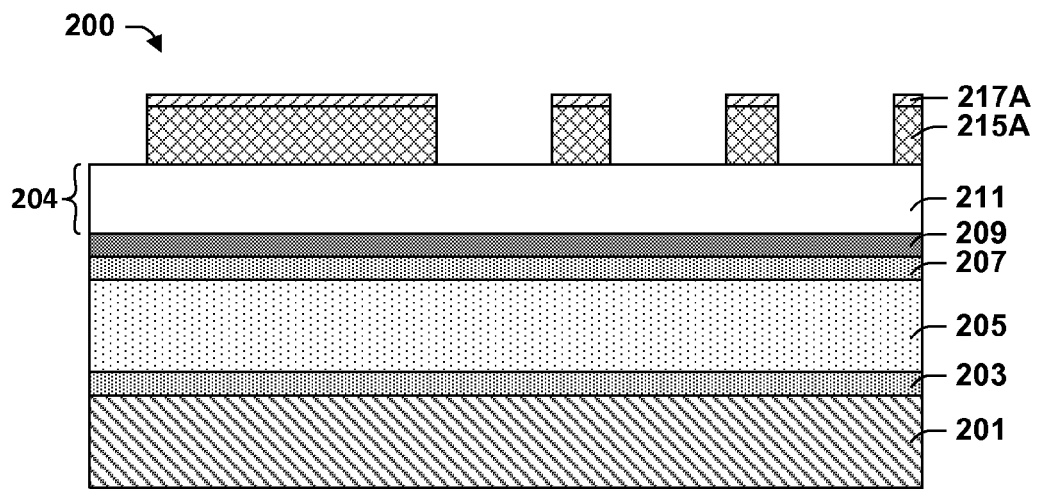

By photolithography, photoresist layer 219A is patterned as shown in FIG. 4. By etching, the pattern of photoresist layer 219A is transferred to the other layers of lithographic mask 206A as shown in FIG. 5. In some embodiments, the etch process conditions are selected to slightly over-etch when transferring features from photoresist layer 219A to middle layer 217A or when printing from middle layer 217A to bottom layer 215A, whereby the sizes of features printed to bottom layer 215A are somewhat larger than those of the corresponding features in the original pattern printed in photoresist layer 219A. In some embodiments, the etch process condition are selected to slightly under-etch when printing from photoresist layer 219A to middle layer 217A or when printing from middle layer 217A to bottom layer 215A, whereby the sizes of features printed to bottom layer 215A are somewhat smaller than those of the corresponding features in the original pattern printed in photoresist layer 219A. A first stage of transferring can break through middle layer 217A. Thereafter, middle layer 217A can operate as a mask through a second stage in which bottom layer 215A is printed. Photoresist layer 219A can be removed by the etch process of this second stage to produce a structure as shown in FIG. 5.

Figure 6:
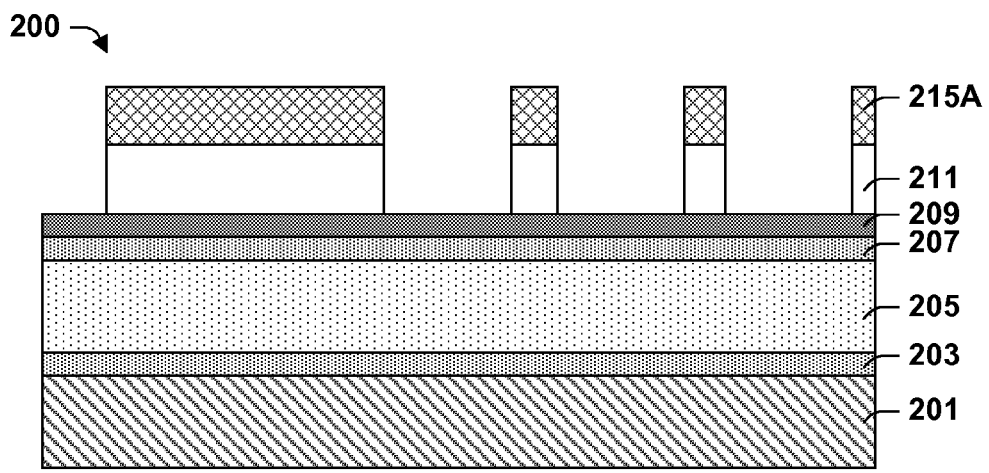
Figure 7:
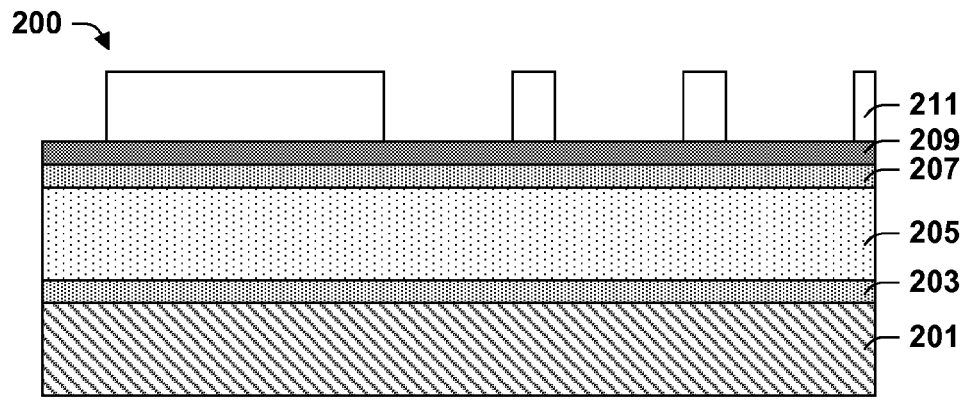

Process 100A continues with act 109, which is etching mandrel layer stack 211 to form mandrel 211 to produce a structure as shown in FIG. 6. In most embodiments, hard mask layer 209 provides an etch stop for etching 109. In some embodiments, etching 109 removes middle layer 217A of a tri-layer lithographic mask 206A as shown in FIG. 6. In some embodiments, etching 109 is plasma etching using process conditions that provide selectivity for removing the material of organosilicate polymer layer 211 in comparison to hard mask layer 209. In some embodiments, the gases used for etching 109 include a compound of the form $CF_X$. Examples of compounds of the form $CF_X$ include, without limitation, $CF_4$, $CHF_3$, and $CH_2F_2$. In some embodiments, etching 109 is plasma etching without chlorine compounds, bromine compounds, or other compounds effective for plasma etching TiN.

Process 100 continues with act 111, which is removing the remaining portion of lithographic mask 206A. In some embodiments, removing lithographic mask 206A includes ashing. Ashing 111 is carried out with a chemistry that has little or no effect on the material of organosilicate polymer layer 211. In some embodiments, ashing 111 is carried out with a low temperature plasma. In some embodiments, the ashing chemistry is one of $CO_2$, $O_2$, and $N_2/H_2$.

Figure 8:
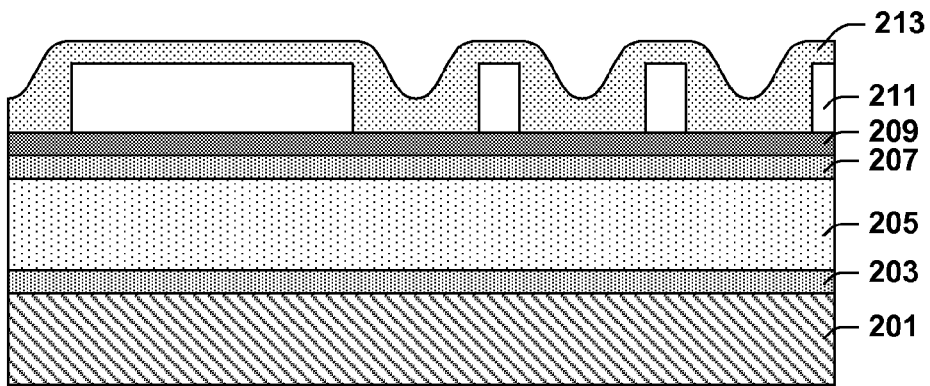

Process 100 continues with act 113, which is forming a spacer material layer 213 over mandrel 211 to produce a structure as shown in FIG. 8. In most embodiments, spacer material layer 213 is formed by a conformal deposition process. A conformal deposition process forms a coating that is relatively uniform in thickness over the surface being coated. Examples of conformal deposition processes include atomic layer deposition (ALD) and most chemical vapor deposition (CVD) processes.

Spacer material layer 213 is formed at temperatures below temperatures at which organosilicate polymer layer 211 would be excessively damaged. Spacer material layer 213 can have any suitable composition. Examples of compositions that can be suitable for spacer material layer 213 include, without limitation, SiN, SiON, $SiO_2$, SiC and SiOC. In most embodiments, spacer material layer 213 is formed at temperatures below 300° C. In some embodiments, spacer material layer 213 is formed at temperatures below 200° C. In most embodiments, spacer layer 213 is a non-metallic compound. In some embodiments, spacer layer 213 is a low temperature oxide. In some embodiments, the composition of spacer material layer 213 is SiC or SiOC. The spacer materials of these embodiments can enable low temperature processing and lend themselves to etch conditions with the desired selectivity.

Figure 9:
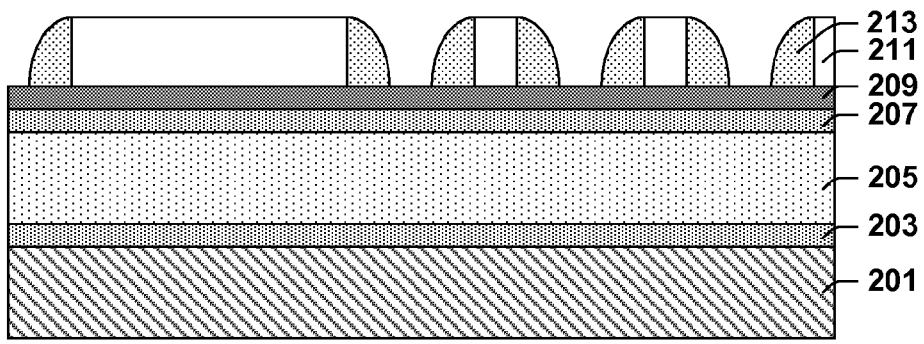

Process 100 continues with act 115, which is etching spacer material layer 213 to form spacers 213 as shown in FIG. 9. Spacers 213 abut mandrel 211 without being below or above mandrel 211 to any significant degree. In most embodiments, etching 115 is carried out with a selectivity for removing the material of spacers 213 over the material of hard mask 209. In some embodiments, etching 115 is plasma etching with a fluorine-based chemistry. In some embodiments, the gases used for etching 115 include $CF_4$. In some embodiments, etching 115 is plasma etching without chlorine compounds, bromine compounds, or other compounds effective for plasma etching TiN. In some embodiments, etching 115 is carried out with a selectivity for removing the material of spacers 213 over the material of organosilicate polymer layer 211.

Figure 10:
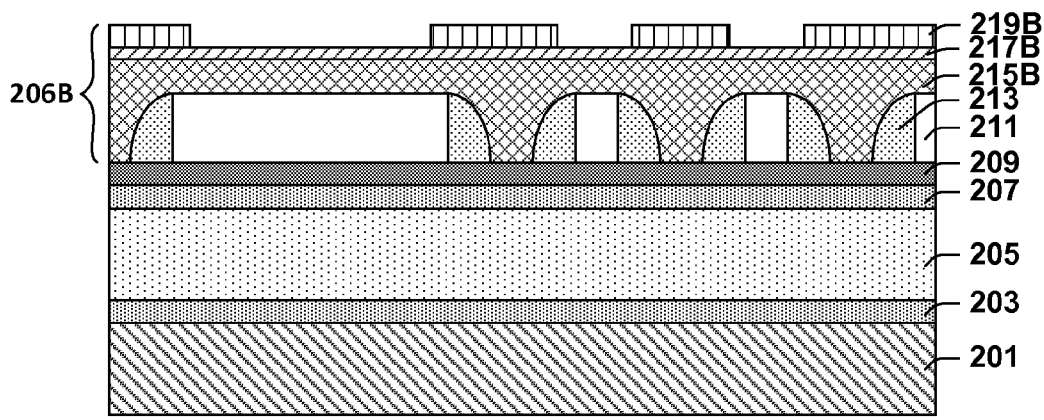

Process 100 continues with act 117, which is forming and patterning a second lithographic mask 206B over organosilicate polymer layer 211 and spacers 213 to produce a structure as shown in FIG. 10. In some embodiments, lithographic mask 206B is a patterned photoresist. In some embodiments, lithographic mask 206B includes one or more layers formed beneath the photoresist and patterned using the photoresist.

The purpose of lithographic mask 206B is removing an additional portion of mandrel layer stack 204 and thereby further patterning mandrel layer stack 204. In some embodiments lithographic mask 206B includes at least an upper layer that is a photoresist and an underlying layer that is thicker than the photoresist, which provides advantages as described for corresponding embodiments of lithographic mask 206A. The photoresist can be used to pattern the thicker underlying layer, and the patterned underlying layer can then be used as the mask for the further patterning of mandrel layer stack 204. In some embodiments, lithographic mask 206B is a tri-layer mask as shown in FIG. 10. These mask layers can be formed by spin coating, for example.

A tri-layer lithographic mask 206B includes a bottom layer 215B, a middle layer 217B, and a photoresist layer 219B. Photoresist layer 219B is a photoresist material. In some embodiments, bottom layer 215B is a polymer, such as a polymer suitable for forming a bottom anti-reflective coating. Bottom layer 215B is thick in comparison to middle layer 217B and photoresist layer 219B. In some embodiments, bottom layer 215B is from 1000 to 3000 Å thick. Middle layer 217B is optional. In some embodiments, middle layer 217B is a polymer like bottom layer 215B, but with a higher silicon content. In some embodiments, middle layer 217B includes from 10% to 70% Si. In some embodiments, bottom layer 215B is a polymer with no Si content.

Figure 11:
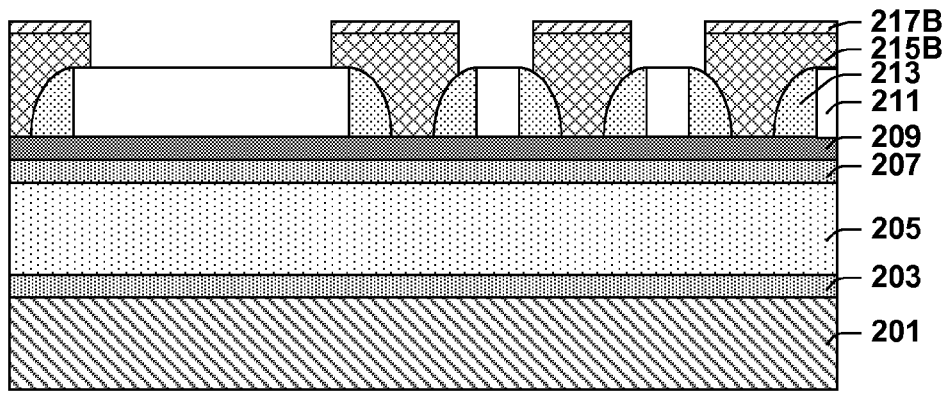

By photolithography, photoresist layer 219B is patterned as shown in FIG. 10. By etching, the pattern of photoresist layer 219B is printed to the other layers of lithographic mask 206B as shown in FIG. 11. In some embodiments, the etch process conditions are selected to slightly over-etch when printing from photoresist layer 219B to middle layer 217B or when printing from middle layer 217B to bottom layer 215B, whereby the sizes of features printed to bottom layer 215B are somewhat larger than those of the corresponding features in the original pattern printed in photoresist layer 219B. In some embodiments, the etch process conditions are selected to slightly under-etch when printing from photoresist layer 219B to middle layer 217B or when printing from middle layer 217B to bottom layer 215B, whereby the sizes of features printed to bottom layer 215B are somewhat smaller than those of the corresponding features in the original pattern printed in photoresist layer 219B. A first stage of printing can break through middle layer 217B. Thereafter, middle layer 217B can operate as a mask through a second stage in which bottom layer 215B is printed. Photoresist layer 219B can be removed by the etch process of this second stage to produce a structure as shown in FIG. 11.

Figure 12:
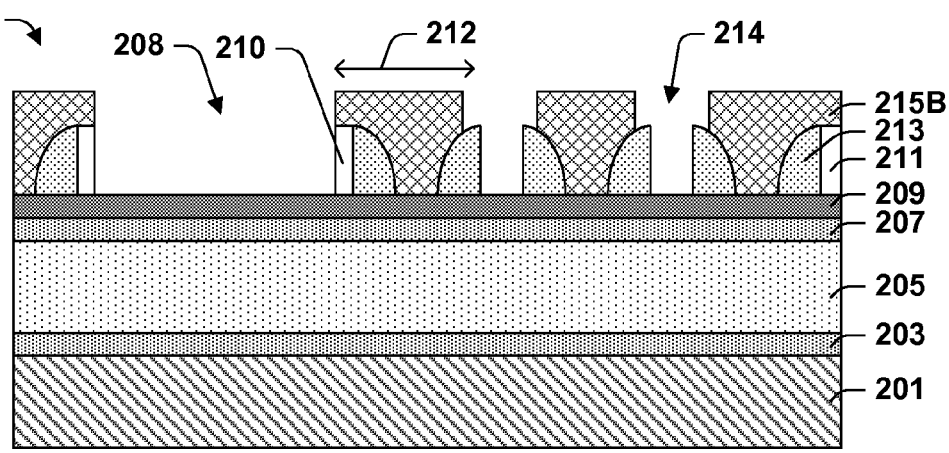

Process 100 continues with act 119, which is etching though mandrel 211 where it is exposed through openings in lithographic mask 206B to produce a structure as shown in FIG. 12. Etching 119 can form wide openings 208. Etching 119 can leave some portions 210 of mandrel 211 adjacent spacers 213 to create wider spacing 212 between adjacent trenches at locations where such wider spacing is desirable. Etching 119 can remove mandrel 211 completely from areas 214 where it is desired for adjacent lines to be defined by spacers 213 only, thereby providing a very narrow line spacing. In most embodiments, hard mask layer 209 provides an etch stop for etching 119. In some embodiments, etching 119 removes middle layer 217B of a tri-layer lithographic mask 206B as shown in FIG. 12. In some embodiments, etching 119 is plasma etching using process conditions that provide selectivity for removing the material of organosilicate polymer layer 211 in comparison to hard mask layer 209. In some embodiments, the gases used for etching 119 include a compound of the form $CF_X$. In some embodiments, etching 119 is plasma etching without chlorine compounds, bromine compounds, or other compounds effective for plasma etching TiN. In most embodiments, etching 119 is carried out with a selectivity for removing the material of organosilicate polymer layer 211 over the material of spacers 213.

Figure 13:
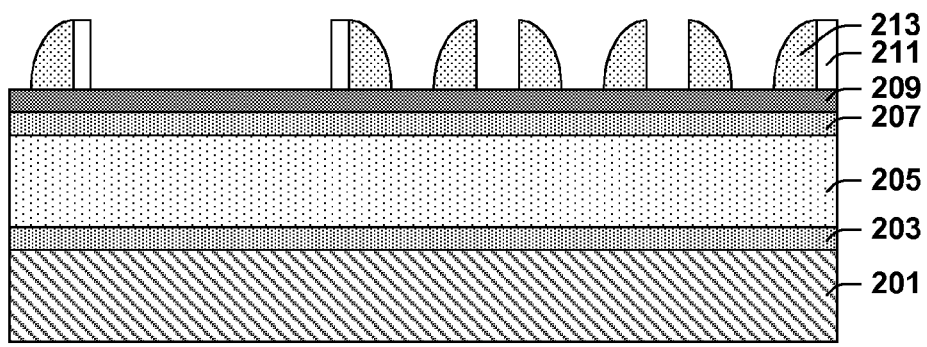

Process 100 continues with act 121, which is removing the remaining portion of lithographic mask 206B to produce a structure as shown in FIG. 13. In some embodiments, removing lithographic mask 206B includes ashing. Ashing 121 is carried out with a chemistry that has little or no effect on the material of organosilicate polymer layer 211. In some embodiments, ashing 121 is carried out with a low temperature plasma. In some embodiments, the ashing chemistry is one of $CO_2$, $O_2$, and $N_2/H_2$.

Process 100 continues with act 123, which is etching though hard mask 209 with spacers 213 and the remaining portion of mandrel 211 providing a mask. Etching 123 prints hard mask 209 with a pattern defined by spacers 213 and mandrel 211. The pattern can have critical dimensions that are narrower than the critical dimensions of the lithography processes of act 107 and act 117. In some embodiments, a critical dimension of the pattern printed to hard mask 209 is about half the critical dimension of the lithography processes of act 107. In some embodiments, a critical dimension of the pattern printed to hard mask 209 is about half the critical dimension of the lithography processes of act 117. In some embodiments, etching 123 is plasma etching with either a chlorine or a bromine compound. In some embodiments, etching 123 is plasma etching with compounds effective for plasma etching TiN.

Figure 14:
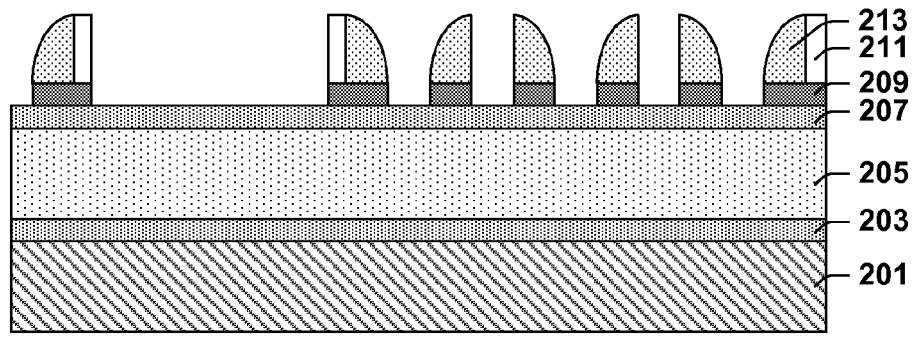

After hard mask 209 has been patterned, the remaining mandrel 211 and spacers 213 can be removed by act 125 to produce a structure as shown in FIG. 14. Removing mandrel 211 and spacers 213 at this stage of processing is optional. In some embodiments, mandrel 211 and spacers 213 are left to pad hard mask 209 and further sustain hard mask 209 through act 127.

Figure 15:
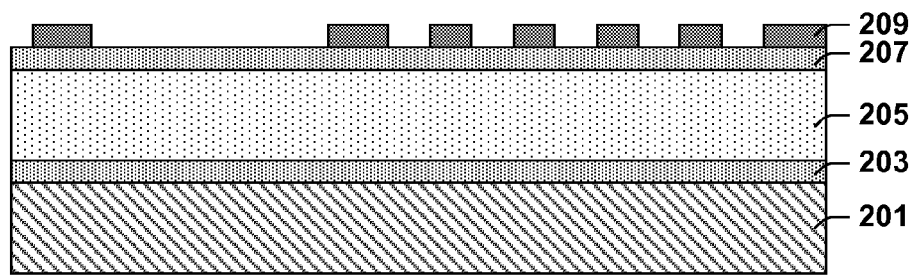
Figure 16:
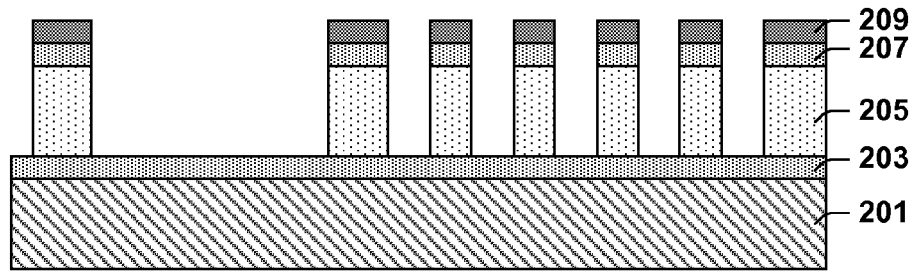

Process 100 continues with act 127, which is treating substrate 202 using patterned hard mask 209. FIG. 15 provides an example, wherein the treatment is an etch process that forms trenches or holes is dielectric layer 205 as shown in FIG. 16. In some embodiments, this etching is part of a damascene process in which the trenches and holes are formed in dielectric layer 205. The trenches and holes can subsequently be filled with conductive material to form conductive vias and lines. In some embodiments, double patterning process 100 provides an interconnect structure with narrow pitch lines. In some other embodiments, double patterning process 100 produces field effect transistors (FETs) with short channel length or narrowly pitched gates. In some other embodiments, double patterning process 100 produces narrowly pitched semiconductor fins for finFETs.

The present disclosure provides a process of forming an integrated circuit device. The process includes forming a hard mask layer over a substrate and forming a mandrel layer stack over the hard mask layer. At least the uppermost layer of the mandrel layer stack is an organosilicate polymer. The process continues by forming a first lithographic mask over mandrel layer stack, etching the mandrel layer stack through the first lithographic mask to form a mandrel, and removing the first lithographic mask. A spacer material is deposited over the mandrel and etched to form spacers on the sides of the mandrel. The process continues by forming a second lithographic mask over mandrel and spacers, etching through the mandrel where the mandrel is exposed through the second lithographic mask, and removing the second lithographic mask. The hard mask layer is then etched through a mask that is provided by the spacers and the mandrel, thereby patterning the hard mask layer. The substrate is treated using the resulting hard mask. In some embodiments, the spacers are formed of a low temperature oxide. In some embodiments, the hard mask is TiN. The process provides a simplified method of double patterning that eliminated the need for a capping layer over the hard mask.

The present disclosure also provides a method of manufacturing an integrated circuit device that includes depositing a hard mask layer over a semiconductor body. forming an organosilicate polymer layer above the hard mask layer, forming a first mask above the organosilicate polymer layer, etching the organosilicate polymer layer to a pattern corresponding to the first mask thereby producing a first-patterned organosilicate polymer layer, forming a conformal layer of a second material over the first-patterned organosilicate polymer layer, etching the second material to form spacers abutting the first-patterned organosilicate polymer layer, forming a second mask above the organosilicate polymer layer, etching the organosilicate polymer layer in pattern corresponding to the second mask to produce a second-patterned organosilicate polymer layer, and removing second mask, and patterning the hard mask layer by etching the hard mask layer through a mask formed by the second-patterned organosilicate polymer layer and the spacers.

The present disclosure also provides a method of manufacturing an integrated circuit device that includes depositing a TiN layer over a semiconductor substrate, forming a silicon-containing antireflective coating above the TiN layer, patterning the antireflective coating to form a mandrel, forming spacers to the sides of the mandrel at temperatures below 300° C., wherein the spacers are formed of a low temperature oxide, further patterning the mandrel, and patterning the TiN layer to a pattern defined by the spacers together with the mandrel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A process of forming an integrated circuit device, comprising:
   forming a hard mask layer over a substrate;
   forming a mandrel layer stack over the hard mask layer, wherein an uppermost layer of the mandrel layer stack is an organosilicate polymer;
   forming a first lithographic mask over mandrel layer stack;
   etching the mandrel layer stack through the first lithographic mask to form a mandrel;
   removing the first lithographic mask;
   depositing a spacer material over the mandrel;

etching the spacer material to form spacers on sides of the mandrel;

forming a second lithographic mask over mandrel and spacers;

etching through the mandrel where the mandrel is exposed through the second lithographic mask to form a reduced mandrel;

removing the second lithographic mask;

etching the hard mask layer through a mask that is provided by the spacers and the reduced mandrel, wherein etching the hard mask layer forms the hard mask layer into a hard mask; and treating the substrate using the hard mask.

2. The process of claim 1, wherein the organosilicate polymer is an anti-reflective coating material.

3. The process of claim 1, wherein the mandrel layer stack is a single layer of a material.

4. The process of claim 1, wherein the mandrel layer stack is formed in direct contact with the hard mask layer.

5. The process of claim 4, wherein the hard mask layer is TiN.

6. The process of claim 1, wherein the spacer material is a low-temperature oxide.

7. The process of claim 1, wherein the depositing of the spacer material over the mandrel is carried out at temperatures of about 300° C. or less.

8. The process of claim 1, wherein the polymer is from 10% to 70% silicon.

9. The process of claim 1, wherein the forming of the mandrel layer stack comprises spin coating precursors of the organosilicate polymer.

10. The process of claim 1, wherein the second lithographic mask masks the hard mask layer where it is not covered by either the mandrel or the spacers.

11. The process of claim 1, wherein the treating of the substrate using the hard mask comprises etching through a dielectric layer where is it exposed through the hard mask.

12. The process of claim 1, wherein the first and second lithographic masks are tri-layer masks.

13. The process of claim 1, wherein the etching of the mandrel layer stack through the first lithographic mask and the etching through the mandrel where the mandrel is exposed through the second lithographic mask are plasma etching with fluorine-based chemistry.

14. The process of claim 1, wherein the etching of the spacer material to form spacers on the sides of the mandrel is plasma etching with fluorine-based chemistry.

15. A method of manufacturing an integrated circuit device, comprising:

depositing a hard mask layer over a semiconductor body;

forming an organosilicate polymer layer above the hard mask layer;

forming a first mask above the organosilicate polymer layer;

etching the organosilicate polymer layer to a pattern corresponding to the first mask to produce a first-patterned organosilicate polymer layer;

forming a conformal layer of a second material over the first-patterned organosilicate polymer layer;

etching the second material to form spacers abutting the first-patterned organosilicate polymer layer;

etching the organosilicate polymer layer in a pattern corresponding to a second mask to produce a second-patterned organosilicate polymer layer;

removing the second mask; and patterning the hard mask layer by etching the hard mask layer through a mask formed by the second-patterned organosilicate polymer layer and the spacers.

16. The method of claim 15, wherein the etching of the organosilicate polymer layer to a pattern corresponding to the first mask is etching with $CF_X$.

17. The method of claim 15, wherein the forming of the organosilicate polymer layer above the hard mask layer forms the organosilicate polymer in direct contact with a TiN layer.

18. The method of claim 15, wherein the forming of a conformal layer of a second material over the first-patterned organosilicate polymer layer is a deposition process taking place at temperatures below 300° C.

19. A method of manufacturing an integrated circuit device, comprising:

depositing a TiN layer over a semiconductor substrate;

forming a silicon-containing antireflective coating above the TiN layer;

patterning the antireflective coating to form a mandrel;

forming spacers to sides of the mandrel at temperatures below 300° C., wherein the spacers are formed of a low temperature oxide;

further patterning the mandrel; and patterning the TiN layer to a pattern defined by the spacers together with the mandrel.

20. The method of claim 19, wherein the antireflective coating is formed in direct contact with the TiN layer.

* * * * *